United States Patent
Gonzalez et al.

(10) Patent No.: US 7,170,322 B2
(45) Date of Patent: Jan. 30, 2007

(54) SYSTEM AND METHOD FOR REDUCING TRANSIENT RESPONSE IN A FRACTIONAL N PHASE LOCK LOOP

(75) Inventors: Armando J. Gonzalez, Miami, FL (US); Joseph A. Charaska, Melrose Park, IL (US); Vadim Dubov, Boca Raton, FL (US); William J. Martin, Fort Lauderdale, FL (US)

(73) Assignee: Motorola, Inc., Schaumburg, IL (US)

( * ) Notice: Subject to any disclaimer, the term of this patent is extended or adjusted under 35 U.S.C. 154(b) by 32 days.

(21) Appl. No.: 11/139,160

(22) Filed: May 28, 2005

(65) Prior Publication Data

US 2006/0267645 A1  Nov. 30, 2006

(51) Int. Cl.
*H03L 7/06* (2006.01)

(52) U.S. Cl. .................................. 327/148; 327/157
(58) Field of Classification Search ................ 327/147, 327/148, 149, 150, 156, 157, 158, 159; 331/1 A, 331/17, 25; 375/373–376
See application file for complete search history.

(56) References Cited

U.S. PATENT DOCUMENTS 6,278,333 B1 * 8/2001 Le et al. ...................... 331/17
6,747,494 B2 * 6/2004 Bushey et al. .............. 327/148

* cited by examiner

*Primary Examiner*—Linh My Nguyen

(57) ABSTRACT

A system and method for reducing a transient response in a phase lock loop (PLL) (100) is disclosed. The system includes an adapt mode charge pump (204), a normal mode charge pump (206) and the use of controlled trickle currents (208), (210) applied to those charge pumps to minimize a transient response of the PLL (100).

12 Claims, 3 Drawing Sheets

SYSTEM AND METHOD FOR REDUCING TRANSIENT RESPONSE IN A FRACTIONAL N PHASE LOCK LOOP

FIELD OF THE INVENTION

This invention relates in general to phase lock loops, and more specifically to the reduction of transient responses occurring in frequency synthesizer charge pumps used in such loops.

BACKGROUND OF THE INVENTION

Phase lock loop (PLL) circuits are used in high-speed communication devices and electronic testing instruments to generate a continuous wave signal at a precise and stable frequency. Phase lock loop circuits generally include a reference frequency, a synthesizer and a voltage controlled oscillator (VCO). Two known synthesizers used in PLL circuits are the integer N synthesizer and fractional N synthesizer. Integer N synthesis utilizes whole integers to synthesize the reference frequency thus providing a coarser resolution than fractional N synthesis, which utilizes fractional levels for a finer resolution.

Reducing lock time in a PLL circuit is always of utmost importance in the design of high-speed communication devices. One technique for reducing lock time includes the use of a regular (speed) charge pump and a faster (speed) charge pump in a fractional N synthesizer to provide for speedier signal acquisition. Unfortunately, the use of two different charge pumps generates a transition, also referred to as a transition glitch, which can negatively impact lock time. Hence, there is a need to minimize or eliminate the transition glitch which will improve the fractional N phase lock loop performance.

BRIEF DESCRIPTION OF THE DRAWINGS

The present invention is illustrated by way of example and not limitation in the accompanying figures, in which like references indicate similar elements, and in which.

DETAILED DESCRIPTION OF THE INVENTION

The instant disclosure is provided to further explain, in an enabling manner, the best modes of making and using various embodiments, in accordance with the present invention. The disclosure intends to enhance the perception and appreciation of the inventive principles and advantages thereof, rather than to limit in any manner the invention. The invention is defined solely by the appended claims, including any amendments made during the pendency of this application, and all the equivalents of the claims, as issued.

It is further understood that the relational terms, if any, such as first and second, top and bottom, and the like, are used solely to distinguish one entity or action from another, without necessarily requiring or implying any actual relationship or order between such entities or actions.

Briefly, in accordance with the present invention, there is provided herein a system and method for reducing a transient response in a phase lock loop (PLL). The PLL formed in accordance with the present invention includes a fractional N synthesizer, wherein the synthesizer includes a charge pump providing an adapt charge pump mode of operation and a normal charge pump mode of operation. Trickle currents are selectively added over predetermined time periods during each mode of operation to minimize lock time and linearize the PLL response.

Figure 1:
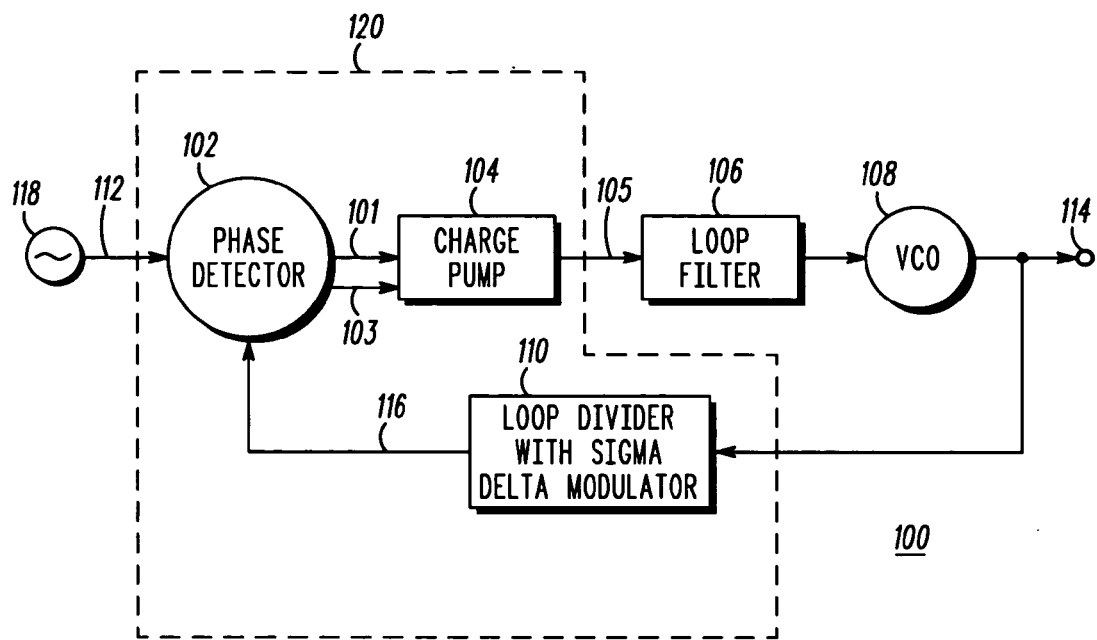
FIG. 1 is a block diagram illustrating a phase lock loop (PLL) in accordance with the present invention.

FIG. 1 is a block diagram illustrating a phase lock loop (PLL) 100 operating in accordance with the present invention. PLL 100 includes reference source 118, fraction-N synthesizer 120, loop filter 106 and voltage controlled oscillator (VCO) 108 generating VCO output 114. The fractional-N synthesizer is formed of a phase detector 102, a charge pump 104, and a loop divider 110 having sigma delta modulator functionality. In accordance with the present invention, charge pump 104 provides both reduced lock time and linearization to PLL 100.

Figure 2:
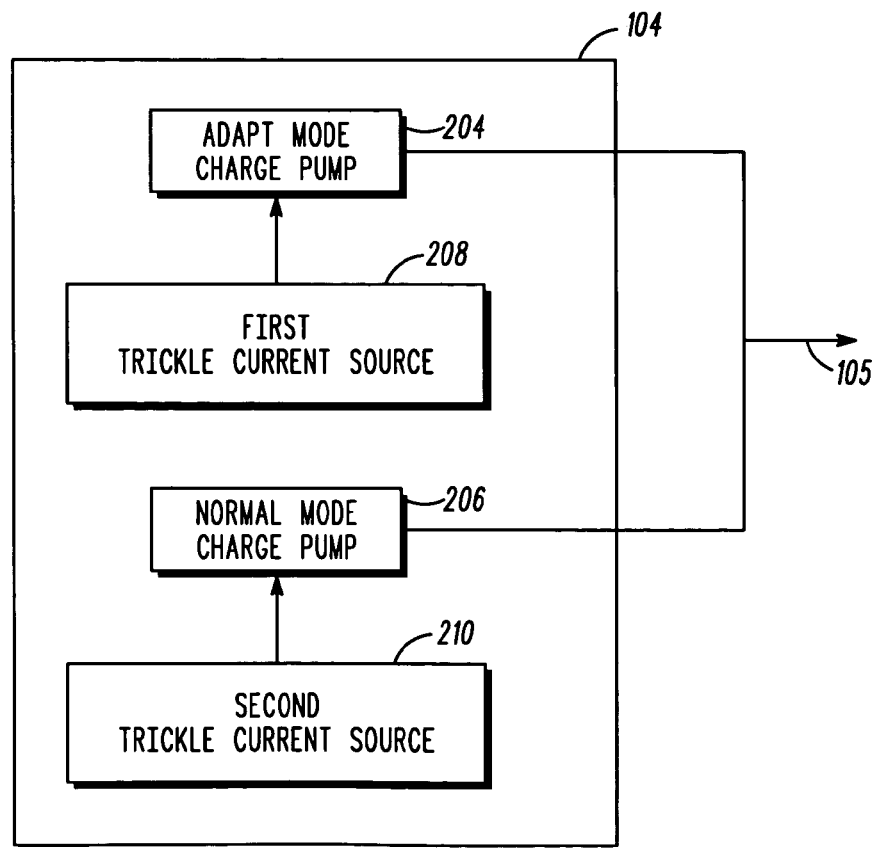
FIG. 2 is a block diagram illustrating and the charge pump of FIG. 1 in accordance with the present invention.

FIG. 2 is a block diagram illustrating the charge pump 104 having both an adapt mode charge pump 204 and a normal mode charge pump 206. A first trickle current source 208 is provided for adding current to the adapt mode charge pump 204, and a second trickle current source 210 is provided for adding current to the normal mode charge pump 206. The duration of the adapt mode is controlled by a timer such that the reference and feedback frequency signals 112, 116 are phase locked in a wide loop bandwidth configuration. After the PLL 100 switches out of the adapt mode and into the normal mode, the loop bandwidth becomes narrower causing less spectral noise. During the time that the adapt mode charge pump 204 is operating, the normal mode charge pump 206 may be operational or non-operational.

Referring to both FIGS. 1 and 2, the phase detector 102 receives two input signals: the reference frequency signal 112 and the feedback frequency signal 116. The phase detector 102 compares the phase of the feedback frequency signal 116 to the phase of the reference frequency signal 112. If the phase of the feedback frequency signal 116 leads the phase of the reference frequency signal 112, the phase detector 102 produces a down signal pulse that has a width proportional to the phase difference. Charge pump output 105 is filtered through the loop filter 106. The charge pump 104 responds to the down signal pulse from the phase detector 102 with a sink current pulse 101 of similar width to the down signal pulse. The loop filter 106 responds to the sink current pulse 101 with an incremental decrease in voltage proportional to the amount of charge in the sink current pulse, which, in turn, causes the output frequency of the VCO 108 to decrease, thus pulling the phase of the feedback frequency source closer to that of the reference frequency source 112.

On the other hand, if the phase of the feedback frequency signal 116 lags the phase of the reference frequency signal 112, the phase detector 102 produces an up signal pulse that has a width proportional to the phase difference. The charge pump 104 responds to the up signal pulse from the phase detector 102 with a source current pulse 103 of similar width to the up signal pulse. The loop filter 106 responds to the source current pulse 103 of the charge pump 104 with an incremental increase in voltage proportional to the amount of charge in the source current pulse, which, in turn, causes the output frequency of the VCO 108 to increase, thus pushing the phase of the feedback frequency signal 116 closer to the phase of the reference frequency signal 112. This process of pulling and pushing the phase of the feedback frequency source closer to phase of the reference frequency source 112 proceeds until the average phase difference becomes negligibly small.

In the adapt mode of operation, high up and down currents flow through the adapt mode charge pump 204. In the normal mode of operation, low up and down currents flow through the normal mode charge pump 206. The magnitude of the up and down currents produced by the adapt mode charge pump 204 are greater than the up and down currents produced by the normal mode charge pump 206. The duration of the adapt mode and normal mode are programmed by a timer or other timing control means. The selective application of trickle currents to each charge pump over predetermine periods of time provides the advantage of a wide loop bandwidth and a faster lock time during the adapt mode, and a narrow loop bandwidth and less spectral noise during the normal mode.

The sigma-delta modulator functionality of divider 110 obtains a time averaged divide number that has a fractional (fractional N) part. The order of sigma-delta modulator determines how the noise spectrum produced at the output 116 of the divider 110 is shaped.

In operation, the first trickle current added to the adapt mode charge pump 206 is preferably proportional to a peak current of the adapt mode charge pump 206 and varies over time with respect to the total adapt time. The amplitude of the second trickle current added to the normal mode charge pump 204 is preferably proportional to the peak current of the normal mode charge pump 204. The proportion of trickle current relative to the peak current depends on the order of the sigma-delta modulator portion of divider 110 and an average divide number being realized.

Figure 3:
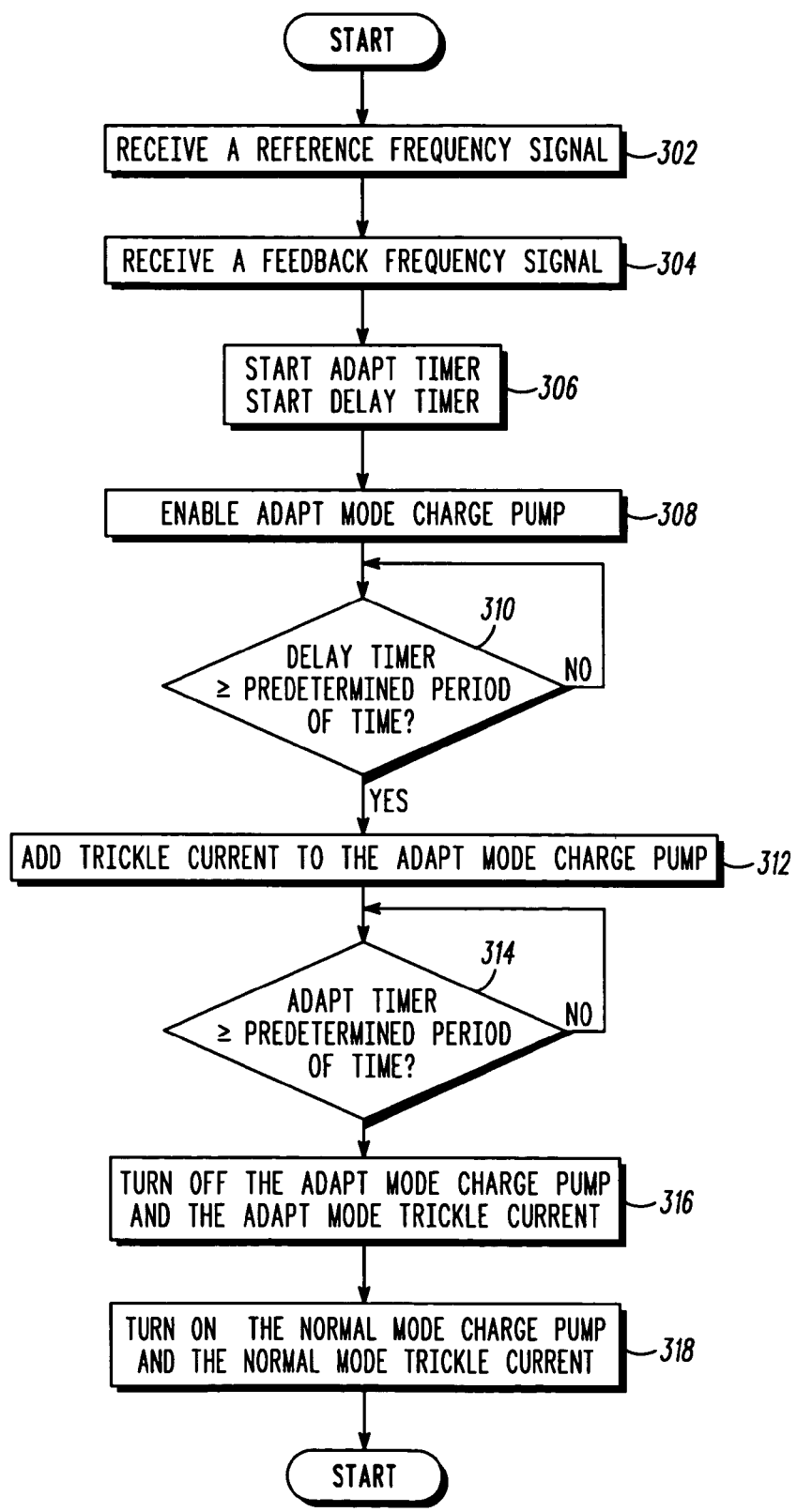
FIG. 3 is a flow chart of a method for minimizing transient response in a phase lock loop in accordance with the present invention.

FIG. 3 illustrates a flow chart of a method for minimizing a transient response in the PLL 100, in accordance with the present invention. At steps 302 and 304, the phase detector 102 receives a reference frequency signal from reference source 118 and a feedback frequency signal from loop divider 110. At step 306, adapt and delay timers are started. At step 308, the adapt mode portion of charge pump 104 is enabled and the delay timer is compared to a predetermined timing threshold at step 310. The adapt mode charge pump remains enabled until such time as the delay timer expires. Once the delay timer threshold is exceeded at step 310, trickle current is added to the adapt mode charge pump at step 312.

As trickle current is added to the adapt mode charge pump at step 312, the adapt timer is compared to a predetermined timing threshold. The adapt mode trickle current will continue to be added to the adapt chare pump until the adapt timer expires. Once the time period has expired at step 314, the adapt mode charge pump and adapt mode trickle current are turned off at step 316. In response to the adapt mode charge pump and adapt mode trickle current being turned off, the normal mode charge pump is turned on and normal mode trickle current is added at step 318.

Figure 4:
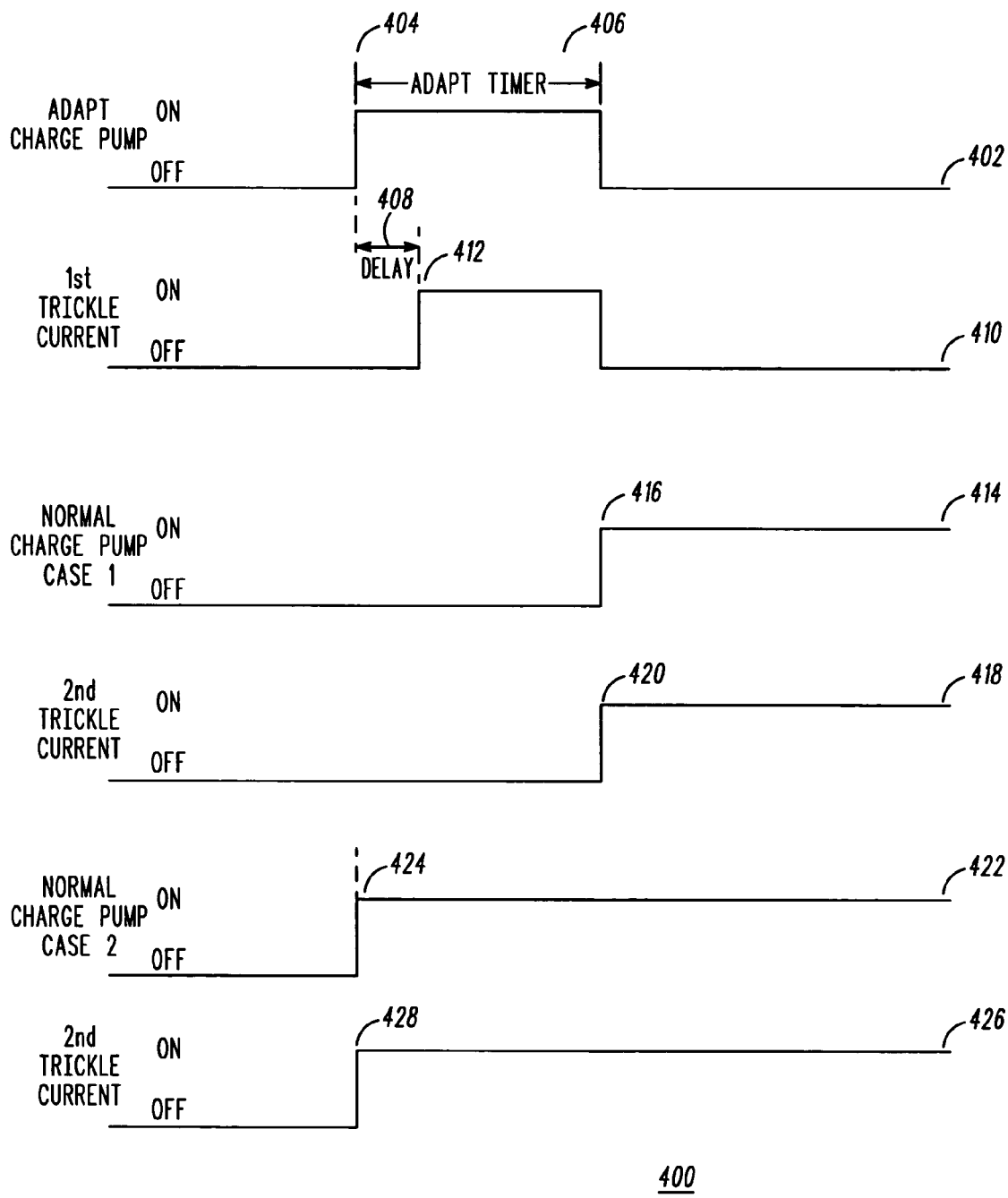
FIG. 4 is a timing diagram summarizing the timing transitions for adapt and normal mode operation.

The delay and selective application of the adapt mode trickle current and normal mode trickle current significantly reduces the phase lock time of the PLL 100 while maintaining linearity. A reduction in the adapt-to-normal mode transition glitch is thus realized. FIG. 4 illustrates a timing diagram 400 summarizing the timing transitions for adapt and normal mode operation. An adapt mode charge pump 402 is enabled at 404 for a predetermined adapt time 406. Upon expiration of a predetermined delay 408, a first trickle current 410, the adapt mode trickle current, is applied to the adapt mode charge pump at 412. The first trickle current is turned off upon expiration of the adapt time 406, thereby transitioning the PLL into a normal mode operation at 416 via normal mode charge pump 414 (case 1) having a second (normal mode) trickle current 418 applied thereto at 420. Alternatively (case 2), a normal charge pump 422 can be turned on at 424 at the same time 404 as the adapt mode charge pump 402 with a second trickle current 426 being applied thereto at 428. Thus, the normal charge pump can be enabled at the beginning or ending of the adapt time 406. In either case, the adapt charge pump is turned on and the application of the adapt trickle current is delayed.

Accordingly, the addition of the first and the second trickle currents to the adapt mode charge pump 204 and normal mode charge pump 206, respectively, is an effective tool that is useful in reducing the transient response. The application of the first/adapt trickle current added to the adapt mode charge pump 204 optimizes the lock time of the PLL system. The second trickle current added to the normal mode charge pump 206 linearizes the phase detector/charge pump for use in a fractional-N synthesizer and minimizes any deleterious effects of the first trickle current.

This disclosure is intended to explain how to fashion and use various embodiments in accordance with the invention rather than to limit the true, intended, and fair scope and spirit thereof. The foregoing description is not intended to be exhaustive or to limit the invention to the precise forms disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A phase lock loop (PLL) including a charge pump, the charge pump comprising:
   an adapt mode charge pump enabled for a first predetermined period of time prior to having a first trickle current added by a first trickle current source;
   the first trickle current being turned off and the adapt mode charge pump being disabled upon expiration of a second predetermined period of time; and
   a normal mode charge pump having a second trickle current added by a second trickle current source.

2. The PLL of claim 1, wherein the first trickle current added to the adapt mode charge pump minimizes phase lock time of the PLL.

3. The PLL of claim 1, wherein the second trickle current added to the normal mode charge pump linearizes the PLL.

4. The PLL of claim 1 further including:
   a phase detector;
   a loop filter, the loop filter coupled to the charge pump;
   a voltage controlled oscillator (VCO) coupled to the loop filter;
   a divider providing feedback between the VCO and the phase detector; and
   a first timer for delaying the application of the first trickle current to the adapt mode charge pump for the first predetermined period of time; and a second timer for setting the second predetermined period of time with which to disable the adapt mode charge pump and first trickle current.

5. A method for minimizing a transient response in a fractional-N phase lock loop (PLL), the method comprising:
providing a charge pump having an adapt mode of operation and a normal mode of operation;
adding a first trickle current to an adapt mode charge pump by a first trickle current source; and
disabling the adapt mode charge pump and first trickle current after a predetermined period of time to transition to normal mode operation with a normal mode charge pump.

6. The method of claim 5 wherein the step of adding a first trickle current to the adapt mode charge pump minimizes the lock time of the PLL.

7. The method of claim 5, wherein the normal mode charge pump has a second trickle current added by a second trickle current source to linearize the PLL.

8. The method of claim 5 further comprising the step of delaying the addition of the first trickle current to the adapt mode charge pump to minimize the lock time of the PLL.

9. A phase lock loop (PLL), including:
a synthesizer having a tri-state charge pump providing an adapt mode of operation and a normal mode of operation;
in the adapt mode of operation, an adapt mode charge pump is enabled for a first predetermined period of time, and upon expiration of the first period of time, a first trickle current is added by a first trickle current source for a second period of time; and
upon expiration of the second predetermined period of time, the adapt mode charge pump and first trickle current are disabled and the normal mode of operation is enabled.

10. The PLL of claim 9, wherein the first trickle current added to the adapt mode charge pump minimizes lock time of the PLL.

11. The PLL of claim 10, wherein during the normal mode of operation a normal mode charge pump has a second trickle current added thereto to linearize the PLL.

12. A phase lock loop (PLL), including an adapt mode charge pump, the adapt mode charge pump being enabled for a predetermined adapt time, a trickle current being applied to the adapt mode charge pump by a trickle current source upon expiration of a predetermined delay, the trickle current being disabled upon expiration of the adapt time, thereby transitioning the PLL into a normal mode of operation with a normal mode charge pump.

* * * * *